(12) United States Patent
Lin

(10) Patent No.: US 7,922,498 B2
(45) Date of Patent: Apr. 12, 2011

(54) BURN-IN SOCKET HAVING SELF-CENTERING SUPPORTING BRACKET

(75) Inventor: Wei-Chih Lin, Tu-Cheng (TW)

(73) Assignee: Hon Hai Precision Ind. Co., Ltd., New Taipei (TW)

( * ) Notice: Subject to any disclaimer, the term of this patent is extended or adjusted under 35 U.S.C. 154(b) by 0 days.

(21) Appl. No.: 12/494,334

(22) Filed: Jun. 30, 2009

(65) Prior Publication Data
US 2009/0325413 A1    Dec. 31, 2009

(51) Int. Cl.
*H01R 12/00* (2006.01)

(52) U.S. Cl. ......................................................... 439/71

(58) Field of Classification Search ................... 439/71, 439/526
See application file for complete search history.

(56) References Cited

U.S. PATENT DOCUMENTS

| | | | |
|---|---|---|---|
| 6,083,013 A * | 7/2000 | Yamagishi | 439/71 |
| 6,292,003 B1 * | 9/2001 | Fredrickson et al. | 324/754 |
| 6,388,459 B2 * | 5/2002 | Hamren | 324/755 |
| 6,504,390 B2 * | 1/2003 | Hamren | 324/755 |
| 6,541,991 B1 * | 4/2003 | Hornchek et al. | 324/755 |
| 6,707,309 B2 * | 3/2004 | Sato et al. | 324/755 |
| 7,114,976 B2 * | 10/2006 | Cram | 439/330 |
| 7,556,507 B2 * | 7/2009 | Kunioka et al. | 439/73 |
| 2003/0030458 A1 * | 2/2003 | Van Hove et al. | 324/758 |
| 2008/0280477 A1 | 11/2008 | Hsiao et al. | |
| 2010/0142895 A1 * | 6/2010 | Hsu | 385/75 |

* cited by examiner

*Primary Examiner* — Neil Abrams
(74) *Attorney, Agent, or Firm* — Andrew C. Cheng; Wei Te Chung; Ming Chieh Chang

(57) ABSTRACT

A burn-in socket includes a base, a plurality of terminals received in the base, a self-centering supporting bracket mounted above the base in a floating manner and a plurality of elastic elements mounted between the base and the supporting bracket. The supporting bracket defines a receiving cavity for receiving an IC package, and the receiving cavity has a number of oblique surfaces for leading and supporting the IC package so as to precisely position the IC package in the burn-in socket.

14 Claims, 5 Drawing Sheets

BURN-IN SOCKET HAVING SELF-CENTERING SUPPORTING BRACKET

BACKGROUND OF THE INVENTION

1. Field of the Invention

The present invention relates to a burn-in socket, and more particularly to a burn-in socket having a self-centering supporting bracket in which an IC package can be precisely disposed in a center thereof.

2. Description of the Related Art

IC packages are installed in a printed circuit board to construct a complete circuit with continuous functions. To ensure the functionality and reliability of the electronic package during service life, the IC package must be tested before actual field application. The electronic package in the test usually undergoes an extended period of time at a high temperature, so that any earlier failure of a package can be detected accordingly. A so-called burn-in socket is provided, in which the IC packages are placed in an oven and operated for a time at an elevated temperature, e.g., 140 degrees C., and under a voltage source that is greater than the rated value; those IC packages that continue to perform satisfactorily are then approved for shipment.

US Pub. No. 20080280477, published to Hsiao on Nov. 13, 2008, discloses a typical burn-in socket. The burn-in socket includes a socket body with a plurality of contacts disposed therein, a cover rotatablely coupled to the socket body and at least one slider received in the socket body. The socket body defines a receiving space for receiving an IC package, and the cover has a driving member. The slider has an end engaging with the driving member and another end extending toward the receiving space. When the burn-in socket is in a closed position, the slider supports the IC package to keep a reliable connection between the burn-in socket and the IC package.

However, in Hsiao, the receiving space for receiving the IC package is disposed in the socket body integrally, and the IC package is positioned by inner edges of the socket body. In view of tolerance dimension of the IC package and ZIF (zero insert force), there will be a gap existed between exterior edges of the IC package and the inner edges of the socket body. In this situation, when the IC package is loaded into the receiving space along one inner edge of the socket body, a center of the IC package can't align with a center of the socket body, thus the electrical connection between the IC package and the burn-in socket is influenced.

In view of the above, a new burn-in socket with a self-centering supporting bracket which overcomes the above-mentioned disadvantages is desired.

SUMMARY OF THE INVENTION

Accordingly, an object of the present invention is to provide a burn-in socket with a self-centering supporting bracket for positioning an IC package precisely.

To achieve the above-mentioned object, a burn-in socket in accordance with the present invention, comprising a base, a plurality of terminals and a self-centering supporting bracket. The base includes a platform having a plurality of passageways, and the terminals are received in the passageways. The supporting bracket is assembled above the base in a floating manner along a vertical direction, and the supporting bracket includes a plurality of aligning portions having oblique portions to commonly define a receiving cavity for accommodating and supporting the IC package.

Other objects, advantages and novel features of the invention will become more apparent from the following detailed description when taken in conjunction with the accompanying drawings, in which:

DETAILED DESCRIPTION OF PREFERRED EMBODIMENT OF THE INVENTION

Reference will now be made to the drawings to describe the present invention in detail.

Figure 1:
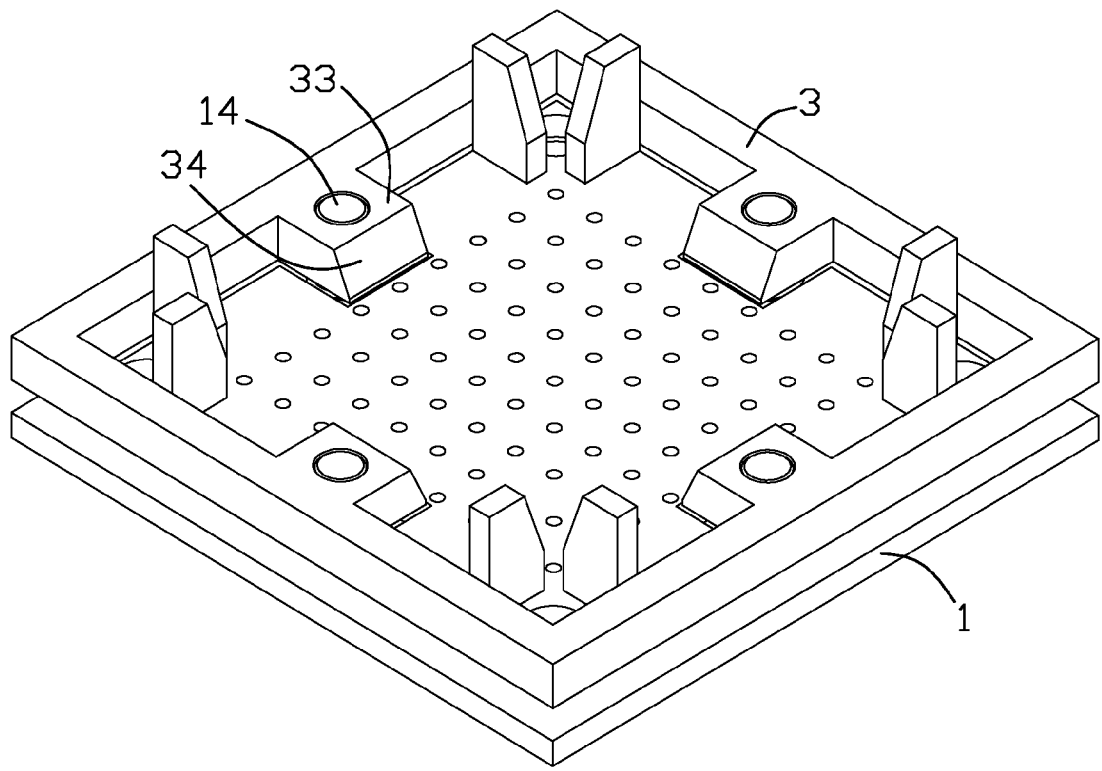
FIG. 1 is an assembled, perspective view of a burn-in socket in accordance with a preferred embodiment of the present invention.
Figure 2:
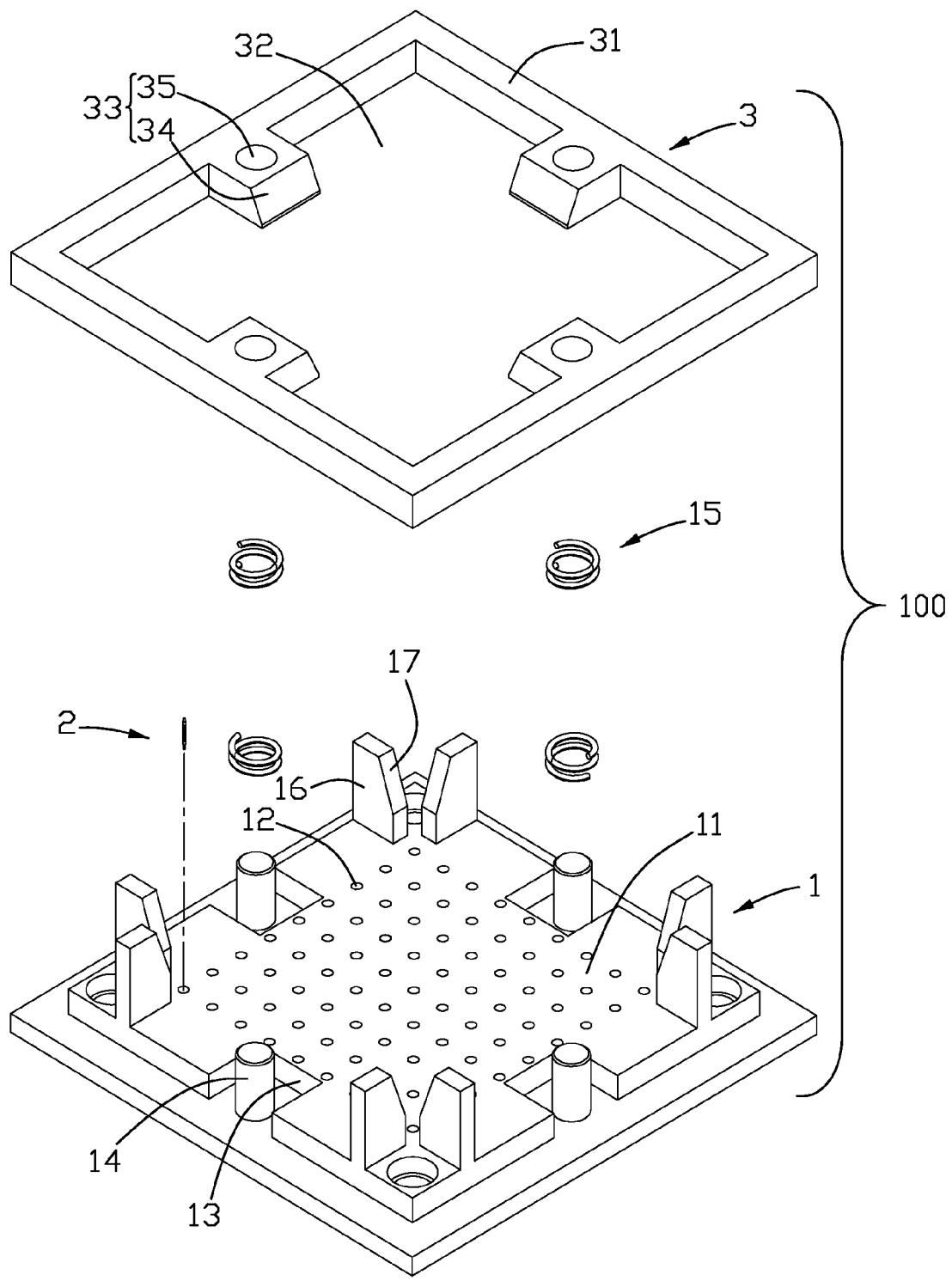
FIG. 2 is an exploded, perspective view of the burn-in socket shown in FIG. 1.
Figure 4:
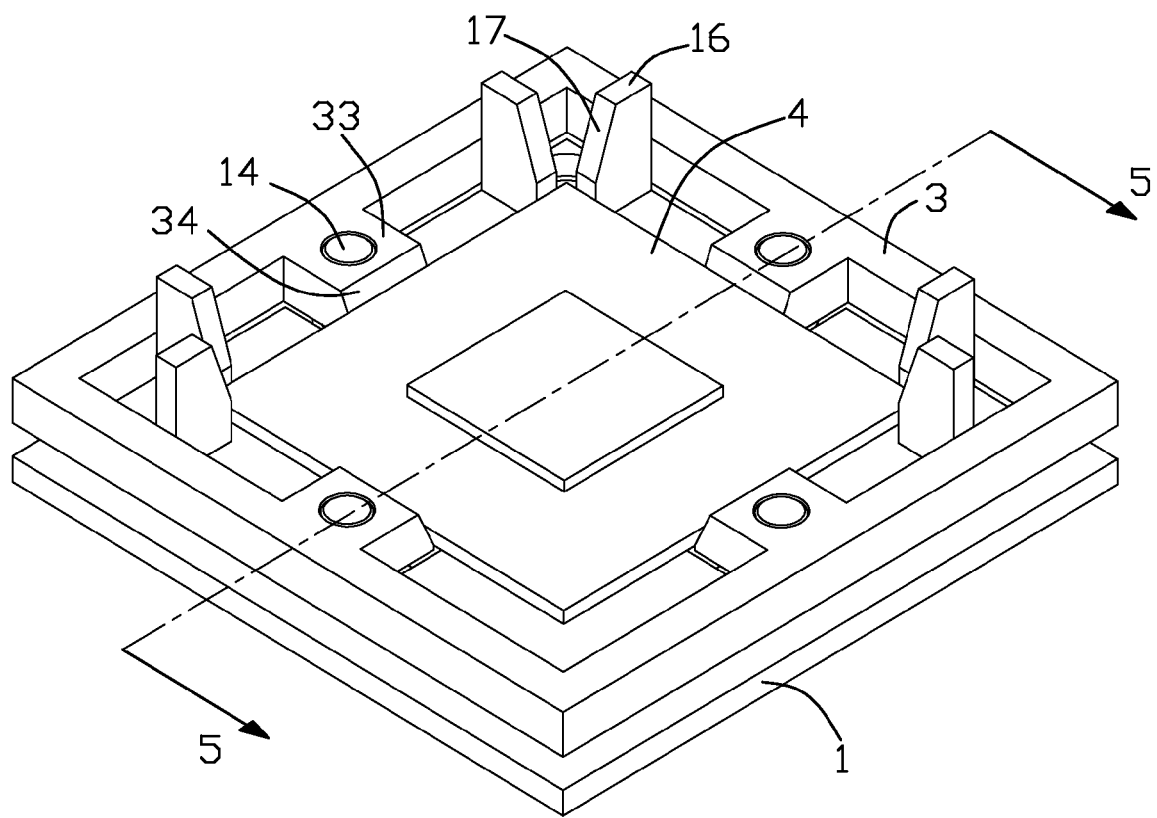
FIG. 4 is similar to FIG. 3, wherein the IC package is in a second position.

Referring firstly to FIGS. 1 and 4, a burn-in socket 100 in accordance with a preferred embodiment of the present invention is disclosed for electrically connecting an IC package 4. The burn-in socket 100 includes a base 1, a plurality of terminals 2 received in the base 1, and a self-centering supporting bracket 3 mounted above the base 1 in a floating manner along a vertical direction.

The base 1 is configured to a rectangular shape and includes a platform 11 in centre thereof, and the platform 11 defines a plurality of passageways 12 passing therethrough. The terminals 2 are received in the passageways 12 for electrically interconnecting with the IC package 4 and a PCB (not shown). Said platform 11 defines four recesses 13 at four sides thereof, and the base 1 further has four posts 14 extending upwardly and vertically from bottom surfaces of the recesses 13, four elastic elements 15 mounted on the posts 14, and four pairs of leading portions 16 projecting upwardly from four corners of the platform 11. Each pair of the leading portions 16 are perpendicular to each other, and each leading portion 16 defines a leading surface 17 sloping toward the terminals 2.

The supporting bracket 3 mounted upon the base 1 in a floating manner. The supporting bracket 3 has a similar dimension with the base 1 and includes four frame edges 31 interconnecting with each other, an opening 32 between the four frame edges 31, and four aligning portions 33 extending from the frame edges 31 into the opening 32. Each aligning portion 33 has an oblique portion 34 with a oblique surface sloping towards the terminals 15 to commonly define a receiving cavity (not labeled) for accommodating and supporting the IC package 4, and a through hole 35 is disposed in centre of each aligning portion 33 for receiving the corresponding post 14 of the base 1. When the supporting bracket 3 is mounted upon the base 1, the posts 14 are inserted into the through holes 35 of the supporting bracket 3, and the supporting bracket 3 is supported by the elastic elements 15 on the posts 14, and the leading portions 17 enter into the opening 32 of the supporting bracket 3 and beyond the supporting bracket 3. Accordingly, when an external force is loaded, the supporting bracket 3 will move downwardly from a regional position along the posts 14 respect to the base 1 and will revert to the regional position when the external force is unloaded.

Figure 3:
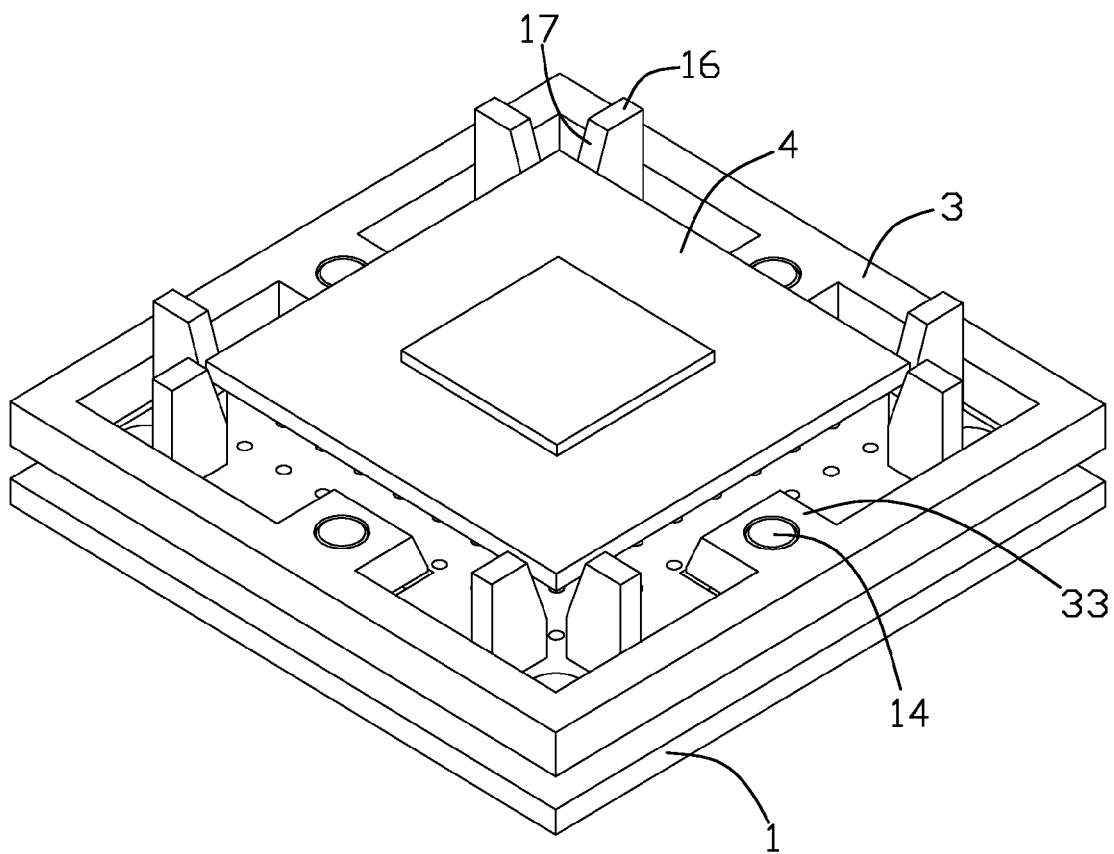
FIG. 3 is an assembled, perspective view of the burn-in socket shown in FIG. 1 with an IC package therein, wherein the IC package is in a first position.
Figure 5:
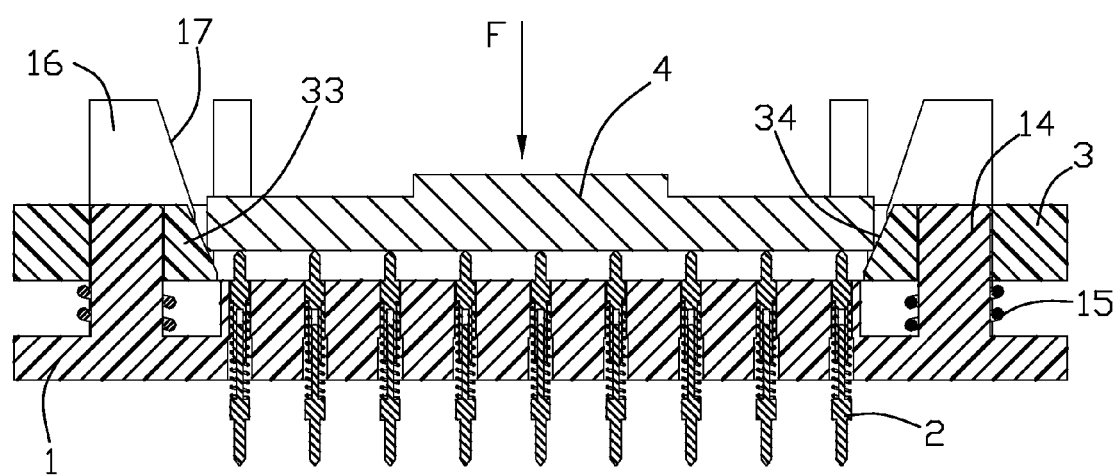
FIG. 5 is a cross-sectional view of the burn-in socket taken along line 5-5 of the FIG. 4.

Now referring to FIGS. 3 to 5, in use, the IC package 4 is assembled into the burn-in socket 100 by two steps. In a first step, the IC package 4 is loaded to the burn-in socket 100 from top to bottom, due to the leading portions 16 are higher than the aligning portions 33, and thus the IC package 4 is firstly leaded by the leading surfaces 17 of the leading portions 16. In a second step, the IC package 4 falls further and is secondly leaded by the oblique portions 34 of the aligning portions 33 and finally is supported by the oblique portions 34. In this situation, the IC package 4 does not contact with the terminals 15 of the burn-in socket 100. When an external force F (ex. a heatsink) is loaded upon the IC package 4, the IC package 4 will drive the supporting bracket 3 to move downwardly together with the IC package 4 till the IC package 4 contacts with the terminals 15 of the burn-in socket 100, and the aligning portions 33 of the supporting bracket 3 are finally received in the corresponding recess 13.

From the foregoing content, it will be seen that, owing to the IC package 4 is supported and positioned by the oblique portions 34 of the aligning portions 33 of the burn-in socket 100, there is no gap between exterior edges of the IC package 4 and the oblique portions 34, and a center of the IC package 4 is always align with a center of the base 1, thus an well electrical connection between the IC package 4 and the burn-in socket 100 is obtained easily.

While preferred embodiment in accordance with the present invention has been shown and described, equivalent modifications and changes known to persons skilled in the art according to the spirit of the present invention are considered within the scope of the present invention as defined in the appended claims.

What is claimed is:

1. A burn-in socket for receiving an IC package, comprising:
    a base including a platform having a plurality of passageways;
    a plurality of terminals received in the passageways of the base; and
    a self-centering supporting bracket assembled above the base in a floating manner along a vertical direction, the supporting bracket having four frame edges interconnecting with each other to form a rectangular configuration and cooperatively define a through opening in a center thereof, a plurality of aligning portions extending from the frame edges into the opening and having oblique portions to commonly define a receiving cavity for accommodating the IC package therein, wherein the opening is formed without a bottom wall so the oblique portion is adapted for constantly supporting the IC package.

2. The burn-in socket as claimed in claim 1, wherein the aligning portion has a substantial trapeziform cross-section along the vertical direction, and the oblique portion slopes toward the terminals.

3. The burn-in socket as claimed in claim 2, wherein the aligning portion defines a hole adjacent the oblique portion, the base has four posts inserting into the holes of the aligning portion and four elastic elements mounted on the posts for supporting the supporting bracket.

4. The burn-in socket as claimed in claim 3, wherein the platform of the base defines four recesses at four sides thereof, and each post extends upwardly and vertically from a bottom surface of the recess, when the supporting bracket moves down, the aligning portion of the supporting bracket is received in the corresponding recess.

5. The burn-in socket as claimed in claim 1, wherein the base includes a plurality of leading portions extending upwardly and vertically thereof into the opening of the supporting bracket and beyond the supporting bracket, when the IC package is assembled, the IC package is firstly leaded by the leading portions and into the receiving cavity of the supporting bracket.

6. A burn-in socket for receiving an IC package, comprising:
    a base including a platform having a plurality of passageways;
    a plurality of terminals received in the passageways of the base; and
    a self-centering supporting member assembled above the base in a floating manner along a vertical direction, said supporting member defining a receiving cavity for receiving the IC package, the receiving cavity extending through the supporting member and including a plurality of oblique surfaces for leading and supporting the IC package and a bottom area surrounded by the oblique surfaces at the bottom of the receiving cavity being smaller than a size of the IC package so as to limit the IC package in the receiving cavity.

7. The burn-in socket as claimed in claim 6, wherein the supporting member includes four frame edges interconnecting with each other and four aligning portions extending from the frame edges into the receiving cavity, the oblique surfaces are disposed on the aligning portions.

8. The burn-in socket as claimed in claim 7, wherein the aligning portion has a substantial trapeziform cross-section along the vertical direction.

9. The burn-in socket as claimed in claim 8, wherein the aligning portion defines a hole adjacent the oblique surface, the base has four posts inserting into the holes of the aligning portion and four elastic elements mounted on the posts for supporting the supporting member.

10. A socket assembly comprising:
    a base defining a plurality of upwardly extending leading portions having first inward oblique faces thereon;
    a plurality of terminals disposed in the base with contact sections thereof;
    a bracket positioned above and being up and down moveable relative to the base and defining a plurality of aligning portions having second inward oblique faces thereon; and
    means for aligning up-and-down movement of the bracket with regard to the base.

11. The socket assembly as claimed in claim 10, wherein the leading portions and the aligning portions are offset from each other around a periphery of a receiving cavity which is defined by both said base and said bracket above said terminals.

12. The socket assembly as claimed in claim 11, wherein the first oblique faces and the second oblique faces are offset from each other in a vertical direction.

13. The socket assembly as claimed in claim 11, wherein said first oblique faces are higher than the second oblique faces when the bracket is moved to a lower position relative to the base.

14. The socket assembly as claimed in claim 13, wherein each of said leading portions further defines a vertical face under the corresponding first oblique face for normally confronting a corresponding edge of the electronic package which is received in said receiving cavity.

* * * * *